United States Patent [19]

Takahashi

[11] Patent Number: 5,275,969
[45] Date of Patent: Jan. 4, 1994

[54] SEMICONDUCTOR LASER

[75] Inventor: Shogo Takahashi, Itami, Japan

[73] Assignee: Mitsubishi Denki Kabushiki Kaisha, Tokyo, Japan

[21] Appl. No.: 43,835

[22] Filed: Apr. 7, 1993

Related U.S. Application Data

[62] Division of Ser. No. 769,373, Oct. 1, 1991, Pat. No. 5,225,370.

[30] Foreign Application Priority Data

Mar. 25, 1991 [JP] Japan ................. 3-87719

[51] Int. Cl.⁵ ............................................ H01L 91/90
[52] U.S. Cl. ........................... 437/129; 437/150; 437/167; 437/987; 148/DIG. 35; 372/45; 372/46
[58] Field of Search ............... 437/129, 167, 151, 150, 437/987; 148/DIG.; 372/45, 46

[56] References Cited

U.S. PATENT DOCUMENTS

| | | | |
|---|---|---|---|
| 4,517,674 | 5/1985 | Liu et al. ........................ | 372/45 |
| 4,960,730 | 10/1990 | Kakimoto ...................... | 437/987 |
| 4,980,313 | 12/1990 | Takahashi ...................... | 437/987 |
| 5,108,949 | 4/1992 | Takahashi ...................... | 437/129 |
| 5,116,769 | 5/1992 | Seiwa ............................. | 437/129 |

FOREIGN PATENT DOCUMENTS 480557   4/1992   European Pat. Off. ............ 437/129

Primary Examiner—Robert Kunemund
Assistant Examiner—Ramamohan Rao Paladugu
Attorney, Agent, or Firm—Leydig, Voit & Mayer

[57] ABSTRACT

A method for diffusing a P type impurity into a semiconductor includes the steps of selectively implanting ions of a first P type impurity into a semiconductor substrate and thermally diffusing a second P type impurity into the semiconductor substrate containing at least a region where the first P type impurity ions are implanted. Therefore, the diffusion speed of the P type impurity is increased in the ion implantation region, whereby the P type impurity diffusion region which almost corresponds to the ion implantation region can be obtained and P type diffusion can be performed in high concentration with high precision.

3 Claims, 4 Drawing Sheets

SEMICONDUCTOR LASER

This application is a division of application Ser. No. 07/769,373, filed Oct. 1, 1991 now U.S. Pat. No. 5,225,370.

FIELD OF THE INVENTION

The present invention relates to a method for diffusing a P type impurity into a small region of a semiconductor material and to a diffusion stripe (DS) type semiconductor laser having a diffusion stripe formed with high controllability.

BACKGROUND OF THE INVENTION

Diffusion of a P type impurity into a predetermined region of a semiconductor material is sometimes used in the process of manufacturing a semiconductor device. FIG. 5 is a view showing a semiconductor laser element in which a current constriction structure and an optical waveguide structure are formed using the conventional method of diffusing a P type impurity. In FIG. 5, reference numeral 1 designates an n type GaAs substrate on which an n type GaAs lower cladding layer 2, a GaAs active layer 3, a p type AlGaAs upper cladding layer 4, an n type AlGaAs layer 5 and a p type GaAs contact layer 6 are sequentially disposed. Reference numeral 9 designates a Zn diffusion region formed from the contact layer 6 to reach the active layer 3. An n side electrode 16 and a p side electrode 17 are formed on a back surface of the substrate 1 and on the contact layer 6, respectively.

Next, a method for forming the Zn diffusion region 9 in the process of manufacturing the semiconductor laser element will be described in reference to FIGS. 3(a)-3(c). The n type AlGaAs lower cladding layer 2 having a thickness of approximately 1 micron, the GaAs active layer 3 having a thickness of approximately 0.1 micron, the p type AlGaAs upper cladding layer 4 having a thickness of approximately 1 micron, the n type AlGaAs layer 5 having a thickness of approximately 0.5 micron and the p type GaAs contact layer 6 having a thickness of approximately 1 micron are sequentially formed on the n type GaAs substrate 1 by epitaxial growth, whereby the structure shown in FIG. 3(a) is obtained. As the growth method, for example a metal organic chemical vapor deposition (MOCVD) method is used. Thereafter, an SiN film 7 serving as a selective diffusion mask is grown on the contact layer 6 and a striped opening pattern having a width w1 is formed at a region where the active region is to be formed as shown in FIG. 3(b). A film 8 serving as a diffusion source in which ZnO and SiO$_2$ are mixed in the ratio of 9:1 is formed on the SiN film 7 having the opening pattern and on the contact layer 6 exposed in the opening as shown in FIG. 3(b). Then, a SiO$_2$ film 15 serving as a surface protecting film at the time of annealing is formed on the ZnO/SiO$_2$ mixed film 8 and then annealing is performed at a diffusion temperature of 650° C. for 1 to 2 hours, whereby Zn is diffused into a wafer from the ZnO/SiO$_2$ mixed film 8 and a Zn diffusion region 9 is formed as shown in FIG. 3(c). Actually, since the diffusion speeds of Zn in GaAs and in AlGaAs are different, the Zn diffusion region 9 spreads differently in the width direction in each layer. However, the cross-sectional boundary of the Zn diffusion region 9 is shown in the form of a partial ellipse in FIG. 3(c) for the sake of simplicity. After the diffusion process, the SiO$_2$ film 15, the ZnO/SiO$_2$ film 8 and the SiN film 7 are removed and then the n side electrode 16 and the p side electrode 17 are formed. Thereafter, the wafer is divided into chips, whereby the laser element shown in FIG. 5 is completed.

The above semiconductor laser element is called a diffusion stripe (DS) type laser. Since the n type AlGaAs layer 5 serves as a current block layer on both sides of the current passage formed by the Zn diffusion region, a current constriction structure is obtained. In addition, in the active layer 3 the refractive index of the region 9 where Zn is diffused is higher than that of the region on both sides thereof where Zn is not diffused, so that light confinement structure in the horizontal direction is achieved. Light confinement in the vertical direction is achieved by the double-heterojunction structure so that a waveguide is formed in the active layer.

According to the DS type semiconductor laser shown in FIG. 5, the width of the active region is determined by the width of the Zn diffusion region 9. The width of the active region of the semiconductor laser has to be set at approximately 2 microns in order to obtain oscillation in a fundamental transverse mode. However, since the same diffusion occurs not only in the depth direction but also in the width direction in the conventional method for diffusing the P type impurity, it is difficult to control the width of the active region. In order to form the Zn diffusion region which penetrates the active layer 3 from the contact layer 6 and reaches the lower cladding layer 2 as shown in FIG. 3(c), a diffusion depth of approximately 3 microns is necessary. The same diffusion in the depth direction occurs also in the width direction as shown by w2 in FIG. 3(c), so that the width w3 of the Zn diffusion region 9 in the active layer 3 is larger than the width w1 of the opening of the SiN film 7 shown in FIG. 3(b). Therefore, the width w1 of the opening of the SiN film 7 must be smaller than a desired width of the active region, for example, at approximately 1 micron. However, since the width w3 of the Zn diffusion region 9 in the active layer 3 depends on the diffusion depth, it is very difficult to precisely control it.

Meanwhile, a precise, narrow P type region may be formed by implantation of P type ions. In this method, a P type impurity is implanted into a semiconductor by irradiating an upper part of the wafer with an anisotropic ion beam using a dielectric film as a mask. According to this method, it is possible to form a narrow P type region because the impurity does not spread in the horizontal direction. However, since the impurity concentration formed by ion implantation is on the order of $10^{18}$ cm$^{-3}$ at the most, it is not applicable to the above laser structure which requires an impurity concentration of $10^{19}$ cm$^{-3}$ or more.

Since the prior art method for diffusing a P type impurity by thermal diffusion is as described above, it is difficult to control diffusion to a narrow region because of diffusion in the horizontal direction.

Further, although ion implantation forms a narrow P type region, sufficient impurity concentration can not be obtained in that method.

SUMMARY OF THE INVENTION

The present invention was made to solve the above problems and it is an object of the present invention to diffuse a P type impurity into a narrow region in a semiconductor in high concentration precisely.

It is another object of the present invention to provide a semiconductor laser device of a diffusion stripe type in which a laser characteristic such as fundamental transverse mode oscillation is improved.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In a method of diffusing a P type impurity according to the present invention, ions of a first P type impurity are selectively implanted into a semiconductor substrate and then a second P type impurity is thermally diffused into a region containing the implanted ions. Since the diffusion speed of the second P type impurity in the region where ions of the first P type impurity are implanted is higher than elsewhere, there is provided a second P type impurity diffusion region whose configuration almost corresponds to that of a first P type impurity ion implantation region.

Further, in a method of diffusing a P type impurity according to the present invention, ions of the first P type impurity are implanted using a resist formed in the process of patterning an SiN film and the SiN film as a mask and the second P type impurity is thermally diffused using the patterned SiN film as a mask. Thus, the P type impurity can be diffused with high precision by simple process.

Still further, in a method of diffusing a P type impurity according to the present invention, when a diffusion stripe of DS type laser is formed, an impurity ion implantation region which penetrates on active layer and reaches an n type semiconductor cladding layer is formed by selectively implanting ions of the first P type impurity from a contact layer surface into a structure of laminated semiconductor layers where the n type semiconductor cladding layer, the semiconductor active layer, a p type semiconductor cladding layer, an n type semiconductor layer and the p type semiconductor contact layer are sequentially formed on an n type semiconductor substrate. Thereafter, a second P type impurity is thermally diffused into the impurity ion implantation region. Thus, the widths of the current passage and the active region can be precisely controlled.

In addition, a DS type semiconductor laser of the present invention comprises an n type semiconductor cladding layer, a semiconductor active layer, a p type semiconductor cladding layer, an n type semiconductor layer and a p type semiconductor contact layer which are disposed on an n type semiconductor substrate, and a diffusion stripe formed by selectively implanting ions of a first P type impurity from the contact layer surface to form an impurity ion implantation region which penetrates the active layer and reaches the n type semiconductor cladding layer and by thermally diffusing a second P type impurity into the impurity ion implantation region. Thus, laser characteristic such as a fundamental transverse mode oscillation are improved.

DETAILED DESCRIPTION OF THE PREFERRED EMBODIMENTS

Figure 1A:
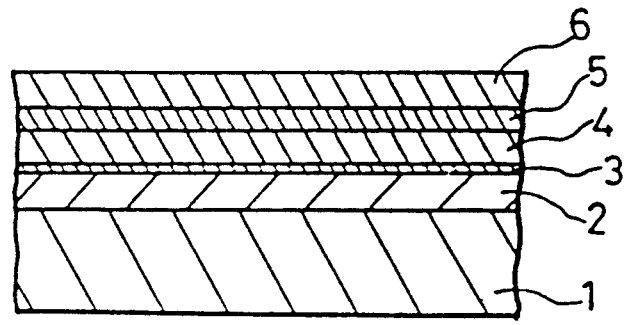
FIGS. 1(a) to 1(c) are sectional views showing a method of diffusing a P type impurity in accordance with a first embodiment of the present invention.
Figure 1B:
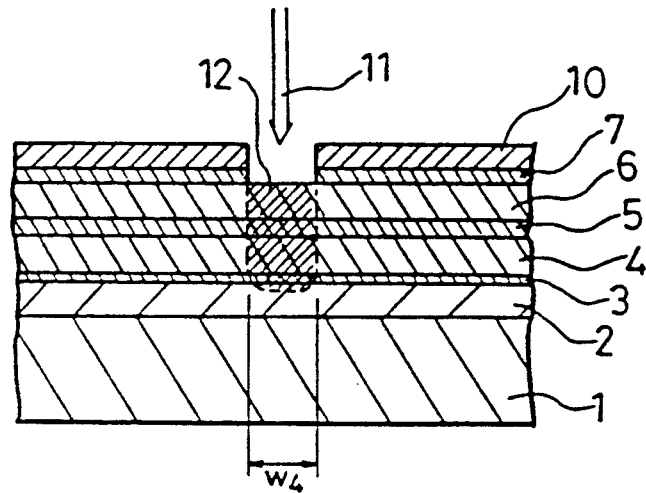
Figure 1C:
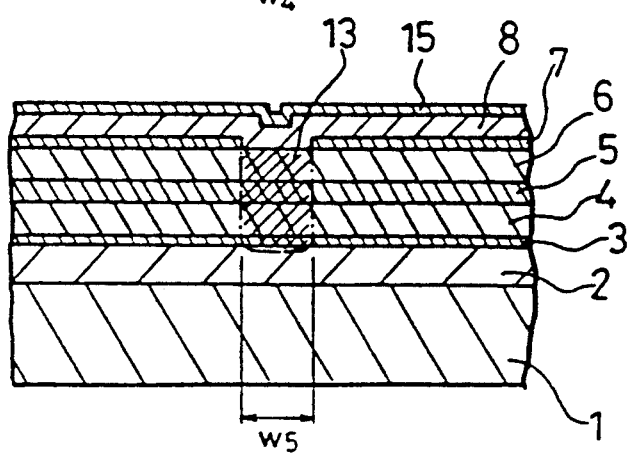

FIGS. 1(a) to 1(c) are sectional views showing a method of diffusing a P type impurity in accordance with a first embodiment of the present invention. This embodiment is used for forming a current constriction structure and a light waveguide structure of a DS type semiconductor laser In the figures, the same reference numerals as in FIGS. 3(a)-3(c) designate the same or corresponding parts.

Figure 3A:
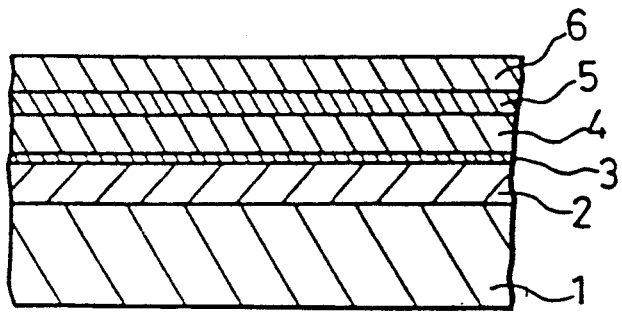
FIGS. 3(a) to 3(c) are sectional views showing the prior art method of diffusing a P type impurity.
Figure 3B:
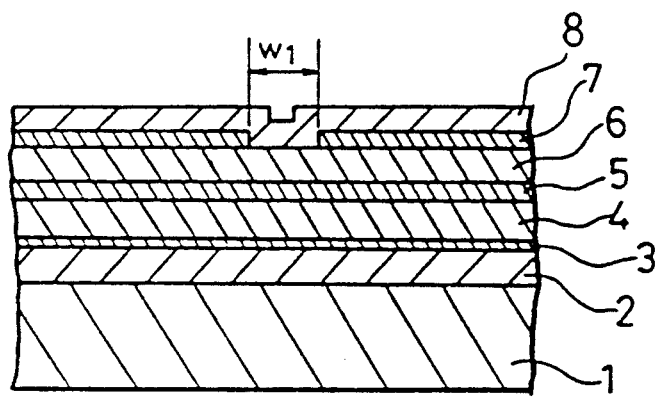
Figure 3C:
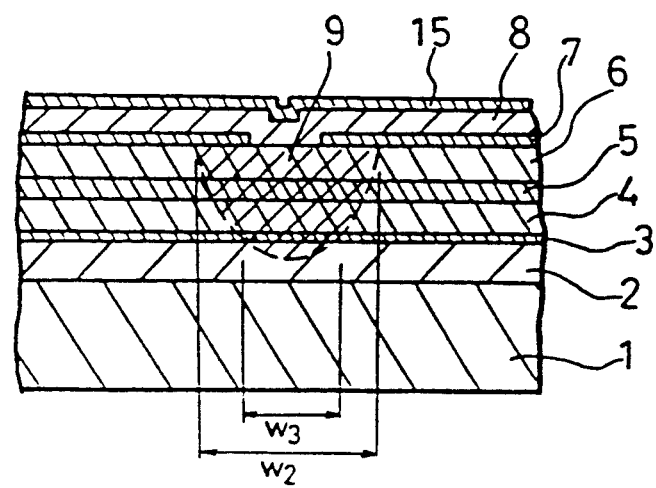

In FIG. 1(b), reference numeral 11 designates a Be ion beam i.e. a first P type impurity, reference numeral 12 designates a Be ion implantation region, reference numeral 10 designates a resist, and other reference numbers designate the same or corresponding parts shown in FIGS. 3(a)-3(c).

Figure 4:
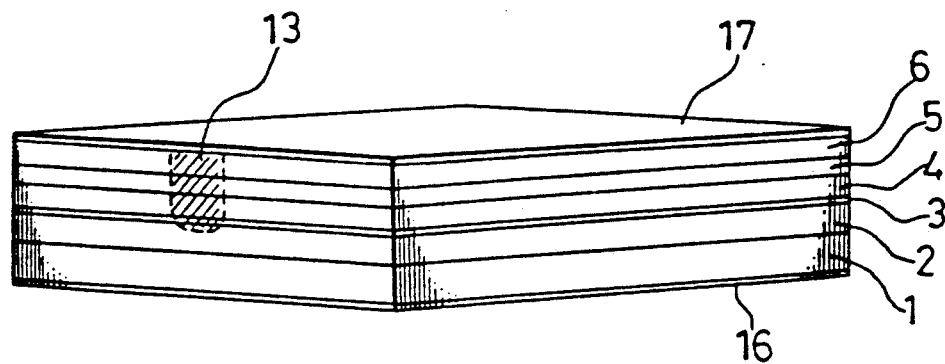
FIG. 4 is a perspective view showing a DS type semiconductor laser element formed by using the method of diffusing the P type impurity of the present invention.
Figure 5:
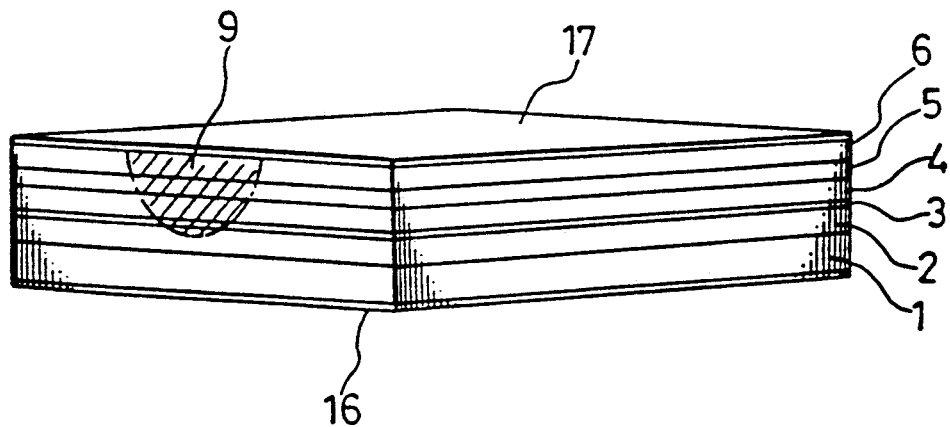
FIG. 5 is a perspective view showing a DS semiconductor laser element formed by using the prior art method of diffusing the P type impurity.

An n type AlGaAs lower cladding layer 2 having a thickness of approximately 1 micron, a GaAs active layer 3 having a thickness of approximately 0.1 micron, a p type AlGaAs upper cladding layer 4 having a thickness of approximately 1 micron, an n type AlGaAs layer 5 having a thickness of approximately 0.5 micron and a p type GaAs contact layer 6 having a thickness of approximately 1 micron are sequentially formed on the n type GaAs substrate 1 by epitaxial growth, whereby the structure shown in FIG. 1(a) is formed. As the growth method, for example metal organic chemical vapor deposition (MOCVD) method is used. Then, an SiN film 7 serving as a selective diffusion mask is formed on the contact layer 6 and then a resist 10 is applied to the SiN film 7. Then, the resist 10 is patterned by photolithography to provide a striped opening having a width w4 at a region where an active region is to be formed as shown in FIG. 1(b) The SiN film 7 exposed in the opening is etched away. In this state, an anisotropic Be ion beam 11 irradiates the upper part of the wafer using the resist 10 and the SiN film 7 as a mask. Be ions are implanted with a dosage of $1 \times 10^{14}/cm^2$ at an energy of 500 keV, whereby a Be implantation region 12 is formed. The depth of the implantation region 12 is approximately 3 microns which penetrates the active layer 3 from the contact layer 6 and reaches the lower cladding layer 2. Thereafter, the resist 10 is removed and the film 8 serving as a diffusion source in which ZnO and $SiO_2$ are mixed in the ratio of 9:1 is formed on the SiN film 7 having the opening and on the contact layer 6 exposed in the opening. Then, an $SiO_2$ film 15 serving as a surface protecting film at the time of annealing is formed on the $ZnO/SiO_2$ mixed film 8 and annealing is performed at a diffusion temperature of 650° C., whereby Zn is diffused into the wafer from the $ZnO/SiO_2$ mixed film 8 and the Zn diffusion region 13 is formed as shown in FIG. 1(c). Generally, it is known that the diffusion speed of a P type impurity increases in proportion to the concentration of the P type impurity in the substrate. On the other hand, it is also known that the diffusion speed of the P type impurity is decreased in the presence of an n type impurity. Although this mechanism is not well understood, it is to be as follows. That is, according to Appl. Phys. Lett., Vol.55, No.19, Nov. 6, 1989, pp.1990, Deal et al., as the diffusion coefficient of the P type impurity depends on the hole concentration in the semiconductor and the hole concentration in the region into which the P type ions are implanted is high, the diffusion speed of the P type impurity in that region is increased. Therefore, since the Zn diffusion speed in the region 12 into which Be is implanted is higher than adjacent Region 12, diffusion in the transverse direction is restrained. Thus, there is provided the Zn diffusion region 13 having a configuration almost corresponds to that of the Be implantation region 12. However, some diffusion of the Be, which was implanted before, actually occurs in the transverse direction during the annealing, so that the width w5 of the Zn diffusion region 13 is a little larger than the width w4 of the Be implantation region 12 just after implantation. For this reason, the width w4 is set so as to be a little smaller than the desired width of the active region, for example at 1.5 micron. After the diffusion process, the SiO2 film 15, the ZnO/SiO2 film 8 and the SiN film 7 are removed and the n side electrode 16 and the p side electrode 17 are formed. Then, the wafer is divided into chips, resulting in a semiconductor laser element. FIG. 4 is a perspective view showing a DS type semiconductor laser element formed by using the method of diffusing the P type impurity in accordance with this embodiment of the present invention.

According to this embodiment, since ions of Be serving as the P type impurity are selectively implanted into the semiconductor layer and then Zn is thermally diffused using the SiN film as a mask which was used as a mask during the ion implantation, the P type impurity can be diffused into a small region in high concentration with high precision and a diffusion stripe of the DS type laser can be formed with high controllability. Thus, laser characteristics such as fundamental transverse mode oscillation of the DS type laser are improved.

In addition, although the SiN film 7 which is used as a mask at the time of ion implantation is used also at the time of thermal diffusion in the above embodiment, since the diffusion speed of the P type impurity is increased in proportion to the concentration of the P type impurity in the substrate as described above, if the P type impurity concentration in the Be implantation region 12 is sufficiently high as compared with the P type impurity concentration in the contact layer 6, a desired Zn diffusion region can be obtained without using the diffusion mask.

Figure 2A:
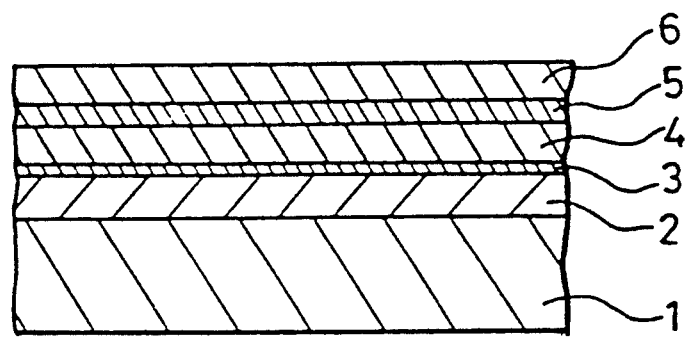
FIGS. 2(a) to 2(c) are sectional views showing a method of diffusing a P type impurity in accordance with a second embodiment of the present invention.
Figure 2B:
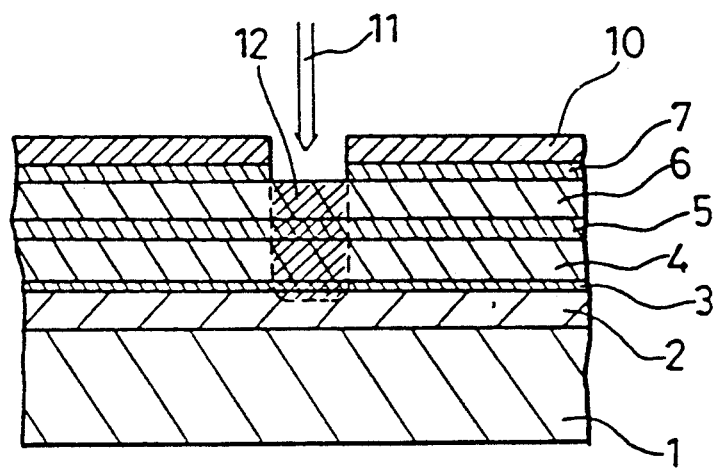
Figure 2C:
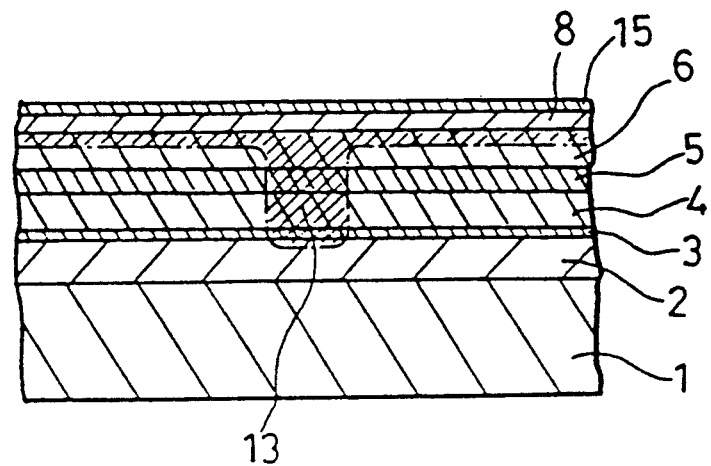

FIGS. 2(a)–2(c) are sectional views showing a method of diffusing the P type impurity in accordance with a second embodiment of the present invention. In this embodiment no diffusion mask is used at the time of thermal diffusion after ion implantation. The process of this embodiment is the same as that of the first embodiment except that the SiN film 7 is also removed when the resist 10 is removed.

In addition, although the DS type semiconductor laser is used for forming a diffusion region in the above embodiments of the present invention, if a waveguide is formed in a semiconductor layer, the present invention can be applied to disordering of a quantum well structure or the like. Further, the configuration of the diffusion is not limited to a stripe, which may be a circle or the like.

In addition, while diffusion is performed into a AlGaAs system semiconductor material in the above embodiments of the present invention, the present invention can be applied to diffusion into an InP system semiconductor material or the like, which attains the same effect as in the above embodiments.

Further, while Be is used as an ion implantation source and Zn is used as a thermal diffusion source in the above embodiments of the present invention, P type impurities such as Mg and Cd or the like may be combined or the same kind of impurity may be used for both the ion implantation source and the thermal diffusion source.

As described above, according to a first aspect of the present invention, since ions of the first P type impurity are implanted into a predetermined region in the semiconductor layer and then the second P type impurity is thermally diffused, the diffusion speed of the P type impurity is increased in the ion implantation region, whereby a P type impurity diffusion region which almost corresponds to the ion implantation region can be obtained and precise P type region with a high concentration results.

In addition, according to a second aspect of the present invention, since the patterned resist and the SiN film are used as a mask when ions of the first P type impurity are implanted and the SiN film after the resist is removed is used as a selective mask when the second P type impurity is thermally diffused, the process can be simplified and the precision of the diffusion configuration is further improved.

Further, according to a third aspect of the present invention, when a diffusion stripe of the DS type laser is formed, the impurity ion implantation region which penetrates the active layer and reaches the n type semiconductor cladding layer is formed by selectively implanting ions of the first P type impurity from the contact layer surface into the structure of semiconductor laminated layers where the n type semiconductor cladding layer, the semiconductor active layer, the p type semiconductor cladding layer, the n type semiconductor layer and the p type semiconductor contact layer are sequentially disposed on an n type semiconductor substrate, and then the second P type impurity is thermally diffused into the semiconductor substrate including the impurity ion implantation region. Thus, the widths of the current passage and the active region can be controlled with high precision.

In addition, according to a fourth aspect of the present invention, the DS type semiconductor laser comprises the n type semiconductor cladding layer, the semiconductor active layer, the p type semiconductor cladding layer, the n type semiconductor layer and the p type semiconductor contact layer which are formed on the n type semiconductor substrate, and the diffusion stripe formed by selectively implanting ions of the first P type impurity from the contact layer surface to form the impurity ion implantation region which penetrates the active layer and reaches the n type semiconductor cladding layer and by thermally diffusing the second P type impurity into the impurity ion implantation region. Thus, a laser characteristic such as a fundamental transverse mode oscillation can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser of diffusion stripe (DS) type comprising:
   an n type semiconductor cladding layer, a semiconductor active layer, a p type semiconductor cladding layer, an n type semiconductor layer, and a p type semiconductor contact layer sequentially disposed on an n type semiconductor substrate; and
   a diffusion stripe penetrating said active layer and reaching said n type semiconductor cladding layer including implanted ions of a first dopant impurity producing P type conductivity, said implanted ions extending from said contact layer in an impurity ion implantation region and a second dopant impurity producing P type conductivity different from the first dopant impurity producing P type conductivity in a thermally diffused region within said impurity ion implantation region.

2. The semiconductor laser in accordance with claim 1 wherein said substrate, said active layer, and said contact layer are GaAs and said n type cladding layer, said p type cladding layer, and said n type semiconductor layer are AlGaAs.

3. The semiconductor laser in accordance with claim 2 wherein said first dopant impurity producing P type conductivity is Be and said second dopant impurity producing P type conductivity is Zn.

* * * * *